United States Patent [19]

Iwata

[11] Patent Number: 5,812,451
[45] Date of Patent: Sep. 22, 1998

[54] NONVOLATILE SEMICONDUCTOR STORAGE APPARATUS AND METHOD OF WRITING DATA TO THE SAME

[75] Inventor: Yoshihisa Iwata, Yokohama, Japan

[73] Assignee: Kabushiki Kaisha Toshiba, Kawasaki, Japan

[21] Appl. No.: 856,800

[22] Filed: May 15, 1997

[30] Foreign Application Priority Data

May 15, 1996 [JP] Japan .................................... 8-145089

[51] Int. Cl.⁶ .................................................. G11C 16/04
[52] U.S. Cl. ................................ 365/185.11; 365/185.22
[58] Field of Search .......................... 365/185.11, 185.22

[56] References Cited

U.S. PATENT DOCUMENTS

| | | | |
|---|---|---|---|
| 5,043,940 | 8/1991 | Harari ...................................... | 365/168 |
| 5,056,062 | 10/1991 | Kuwabara et al. ................. | 365/189.11 |
| 5,097,446 | 3/1992 | Shoji et al. ............................... | 365/195 |
| 5,321,655 | 6/1994 | Iwahashi et al. ........................ | 365/200 |
| 5,386,422 | 1/1995 | Endoh et al. ........................... | 371/21.5 |
| 5,452,249 | 9/1995 | Miyamoto et al. ..................... | 365/185 |
| 5,557,568 | 9/1996 | Miyamoto et al. ................. | 365/185.22 |

OTHER PUBLICATIONS

T. Tanaka, et al., "A Quick Intelligent Program Architecture for 3V—only NAND—EEPROMs," 1992 Symposium on VLSI Circuits Digest of Technical Papers, pp. 20–21, Jun. 1992.

Y. Iwata, et al., "A 35 ns Cycle Time 3.3 V Only 32 Mb NAND Flash EEPROM," IEEE Journal of Solid–State Circuits, vol. 30, pp. 1157–1163, Nov. 1995.

*Primary Examiner*—David C. Nelms
*Assistant Examiner*—Hien Nguyen
*Attorney, Agent, or Firm*—Banner & Witcoff, Ltd.

[57] ABSTRACT

A semiconductor storage apparatus and a method of writing data to the semiconductor storage apparatus can restrict the threshold value of the memory cells, to which data has been written or from which data has been erased, to be included in a predetermined range without excessive writing by performing a verifying operation. In the writing operation, writing is performed such that a first determining level is set to a loose level which is the same as the level set for the reading operation or higher than the loose level but lower than a finally required determining level. In accordance with the first determining level, a first writing operation is performed. Then, a second writing operation is performed in accordance with a second determining level. The threshold value of a memory cell having a threshold value between the first determining level, which is the loose level, and the second determining level which is the required determining level (an aimed determining level) is raised to be higher than the second determining level, that is, the writing operation is performed by two steps. When the width of the distribution of the threshold values is reduced, data can reliably be erased from all of the memory cells when data is collectively erased in the erasing operation.

19 Claims, 13 Drawing Sheets

|   |   | (DATA) |   | (F) | (F) |
|---|---|---|---|---|---|
| 1 | AFTER VERIFY READ OPERATION WITH 0V DETERMINING LEVEL | "1" |   | H | L |
|   |   | "0" |   | H | L |
| 2 | AFTER VERIFY READ OPERATION WITH 0V DETERMINING LEVEL AT SB= "H" | "1" |   | H | L |
|   |   | "0" |   | L | H |
| 3 | AFTER VERIFY READ OPERATION WITH 0.5V DETERMINING LEVEL AT SA= "H" | "1" |   | H | L |
|   |   | "0" | 0.5V<VT | H | L |
|   |   |   | 0<VT<0.5 | L | H |

| N1 | N2 | N3 | VT |
|---|---|---|---|
| H | L | L | $\dfrac{R1}{R+R1} \times VCC$ |
| L | H | L | $\dfrac{R2}{R+R2} \times VCC$ |
| L | L | H | $\dfrac{R3}{R+R3} \times VCC$ |
| H | H | L | $\dfrac{1}{1+R\left(\dfrac{1}{R1}+\dfrac{1}{R2}\right)} \times VCC$ |
| L | H | H | $\dfrac{1}{1+R\left(\dfrac{1}{R2}+\dfrac{1}{R3}\right)} \times VCC$ |
| H | L | H | $\dfrac{1}{1+R\left(\dfrac{1}{R1}+\dfrac{1}{R3}\right)} \times VCC$ |
| H | H | H | $\dfrac{1}{1+R\left(\dfrac{1}{R1}+\dfrac{1}{R2}+\dfrac{1}{R3}\right)} \times VCC$ |

|     | READ | ERASE | WRITE |
| --- | --- | --- | --- |
| BL | 5V PRECHARGE | OPEN | "0" WRITE 0V<br>"1" WRITE 9V |
| SL1 | 5V | 18V | 11V |
| WLn | SELECT 0V<br>NON-SELECT 5V | 0V | SELECT 18V<br>NON-SELECT 9V |
| SL2 | 5V | 18V | 0V |
| W | 0V | 18V | 0V |
| S | 0V | 18V | 0V |

FIG. 10

NONVOLATILE SEMICONDUCTOR STORAGE APPARATUS AND METHOD OF WRITING DATA TO THE SAME

BACKGROUND OF THE INVENTION

The present invention relates to a nonvolatile semiconductor storage apparatus, and more particularly to a semiconductor storage apparatus arranged to perform a verifying operation so as to restrict the threshold value of a memory cell after data has been written or erased from the same to be included in a predetermined range.

Nonvolatile semiconductor storage apparatuses include a PROM (Programmable Read Only Memory), EPROM (Erasable and Programmable ROM), EEPROM (Electrically Erasable and Programmable ROM) and so forth. In particular, the EEPROM permits electrical write/erase of data.

The nonvolatile semiconductor storage apparatuses have been widely used in recent years because of their advantages, for example, that data is saved even if the power supply is interrupted. A flash memory (a flash EEPROM), which is a nonvolatile semiconductor storage apparatus permitting data to be electrically and collectively erased, is different from a two-transistor and byte type nonvolatile semiconductor storage apparatus in that its memory cell can be formed by one transistor. Therefore, the size of each memory cell can be reduced. Moreover, the flash memory has been expected to be employed in place of the magnetic disk having a large capacity.

The nonvolatile semiconductor storage apparatus has a structure such that a memory cell array is formed by disposing, into a matrix configuration, memory cells, each of which is composed of a MOS transistor having a floating gate. The floating gates are applied with respective electric charges to change the threshold values of the MOS transistors. In accordance with the changes in the threshold values, data is stored. Since data is written or erased by causing an electric current to flow in the insulating film, time required to write data is considerably changed when the processes or conditions for use are changed. For example, when Fowler-Nordheim tunneling is used, the electric current will change exponentially to the electric field applied to the insulation film. The electric current is sensitive to the process variation, the variation of the operation conditions, etc., which determine the electric field, resulting in reduction of the writing speed.

The foregoing characteristics are considerably different from those of the DRAM and the SRAM. As a result, cells to which data can be written quickly and those to which data cannot be written quickly coexist in one chip.

Referring to FIG. 8, which is a circuit diagram showing the structures of cells in a NAND flash memory, the conventional nonvolatile semiconductor storage apparatus will now be described. The foregoing flash memory is also applied to the present invention.

As shown in FIG. 8, the NAND flash memory has MOS transistors M1 to M16 each having a floating gate. The foregoing memory cells are connected in series such that an end of each memory cell is connected to a bit line BL through a selection transistor ST1 and another end of the same is connected to a common source line S through a selection transistor ST2. The foregoing MOS transistors are formed on one well of a semiconductor substrate. Control electrodes of the memory cells M1 to M16 are connected to word lines WL1 to WL16, a control electrode of the selection transistor ST1 is connected to a selection line SL1, and a control electrode of the selection transistor ST2 is connected to a selection line SL2.

The memory cells M1 to M16 respectively have threshold values corresponding to data stored therein. For example, the threshold is set to be a level exceeding 0V and as well as lower than 5V when data "0" is stored and the same is set to be a level lower than 0V when data "1" is stored (more adequately, the threshold value is set to be included in a further small range to provide a certain margin).

FIG. 9 is a graph showing distribution of threshold values such that distribution of the number of the threshold values of the foregoing memory cell is shown. The axis of ordinate stands for the threshold value Vth (V) of the memory cell, while the axis of abscissa stands for the number (N) of the memory cells. A state where data "1" is stored in the NAND flash memory is called an erased state, while a state where data "0" is stored is called a written state. An operation performed such that the threshold value of the memory cell storing data "1" is shifted in a positive value direction to store data "0" is called a "writing operation", while an operation performed such that the threshold value (Vth) storing data "0" is shifted in a negative value direction to store data "1" is called an "erasing operation". However, the foregoing definition is sometimes different for a NOR flash memory.

FIG. 10 is a table showing voltages to be applied to the memory cell and having levels corresponding to the erasing operation and the writing operation. When a reading operation is performed, the bit line BL is precharged to 5V to bring the same into a floating state. Then, each of the selection lines SL1 and SL2 is applied with 5V, a word line WL of each of the selected memory cells is applied with 0V, the word line WL of each of the non-selected memory cell is applied with 5V, the cell well W is applied with 0V and the commonly source line S is applied with 0V. As a result, all of the transistors except those for the selected memory cells are turned on.

When data "0" is stored in the selected transistor, the corresponding memory cell is made to be non-conductive, thus causing the potential of the bit line BL to be retained to be 5V. When data "1" is stored in the selected transistor, the corresponding memory cell is made to be conductive. As a result, the bit line BL is electrically discharged, thus causing the potential to be lowered. A data sensing operation is performed by detecting the potential of the bit line BL realized when data is read.

When the erasing operation is performed, the bit line BL is opened (OPEN) and the source line SL1 is applied with 18V, the word line WL of the memory cell is applied with 0V, the source line SL2 is applied with 18V, the cell well W is applied with 18V and the common source line S is applied with 18V. As a result, a tunnel current flows between the floating gate and the well through the gate insulating film, thus causing the threshold value to be 0V or lower.

When the writing operation is performed, voltage, the level of which is varied to correspond to data to be written, is applied. That is, when data "0" is written (when the threshold value is shifted), 0V is applied to the bit line BL. When data "1" is written (the threshold value is not shifted), 9V is applied to the bit line BL. Each of the selected line SL1 is applied with 11V, the word line WL of each of the selected memory cell is applied with 18V, the word line WL of each of the non-selected memory cells is applied with 9V, each of the selected lines SL2 is applied with 0V, the cell well W is applied with 0V and the common source line S is applied with 0V.

The writing operation is performed after the erasing operation, and the data writing is performed from the source side. Thus, all of the transistors from selected transistor Q1 to, for example, memory cell M15 to be data written, are electrically conducted, so that the potential of each transistor has the same level as that of the bit line. Therefore, the memory cell having the bit line BL applied with 0V is brought to a state in which a high voltage of 18V is applied between the channel and the control electrode thereof. As a result, a tunnel current flows, thus causing the threshold value to be shifted in the positive direction. On the other hand, the memory cell having the bit line BL applied with 9V is brought to a state where only 9V is applied between the channel and the control electrode. As a result, positive directional shift of the threshold value is prevented.

When the nonvolatile semiconductor storage apparatus uses the tunnel current, i.e., Fowler-Nordheim tunneling, which is a physical means, to write data, the electric current will change exponentially to the electric field applied to the insulation film. The electric current is sensitive to the process variation, the variation of the operation conditions, etc., which determine the electric field, resulting in reduction of the writing speed. Therefore, a state is sometimes realized in which the threshold value of a certain memory cell is included in a range from 0V or higher and 5V or lower and that of another memory cell exceeds 5V even if the same writing time is required. That is, data "0" is, at a certain time, written in the memory cell on which data can be written at low speed, while the memory cell on which data can be written quickly has, at this time, exceeded the upper limit of 5V of the threshold value of the memory cell which stores data "0". Although the NAND flash memory is arranged to be turned on when 5V is applied to the word line WL of a non-selected memory cell, if the threshold value of a certain memory cell exceeds 5V, data in all of the memory cells, in series, connected to the foregoing memory cell cannot be read.

The reason for this is that the series passage for the electric current is interrupted. Therefore, distribution of the threshold values must be converged to a predetermined value. It is preferable that the distribution of the threshold values be converged to be included in a smaller range to maintain a satisfactorily large margin.

Accordingly, verification for each bit has been employed. The verification for each bit is structured such that the time required to write data is not made to be constant for all of the memory cells but the same is varied for each memory cell. That is, writing time is sectioned into short time sections and an operation is performed in which a cycle including writing—verification—setting of data to be rewritten—rewriting—verification—setting of data to be rewritten is repeated. Data to be rewritten is set such that data is not written in a memory cell, the threshold value of which has been sufficiently raised as a result of the verifying operation, in the following cycles. As a result, the operations for writing data on the memory cells, to which data can be written quickly, are completed and thus the following rise in the threshold value does not take place.

As described above, the nonvolatile semiconductor storage apparatus must restrict the width of the distribution of the threshold values (Vth) of the memory cells to which data has been written or from which data has been erased. Therefore, the writing or erasing operation must be performed while performing verification for each bit. The flash memory has three basic functions consisting of writing, erasing and reading.

The writing function (also called a "program") of the flash memory is an operation in which the threshold value (Vth) of the memory cell is made to exceed 0V. Specifically, writing voltage is applied to the memory cell during the writing pulse time set internally. Then, a verification (check) is, through a sense amplifier, performed whether or not the level of the memory cell has been raised to a predetermined threshold value (hereinafter, the foregoing operation is called a "write verify" operation). Writing including the verification is performed in accordance with an operation sequence shown in FIG. 11.

Now, to describe in detail the operation flow of FIG. 11, first, the operation flow is started, address is inputted, and data is inputted. Then, a determining level is set, and the write operation to the memory cells on a page is performed. Each data writing, the verification, i.e., verify read, is performed with the determining level. If there is any cell or cells in which written data is insufficient, data to be rewritten is set, and the data writing operation and the verify read are performed. This write-verify is repeated until data is sufficiently written in all of the cells on the page, when the determining level is set to the determining level. That is, the write-verify is repeated until electron charges are sufficiently injected in all of the cells on the page, when the determining level is set to the determining level. When data has been sufficiently written in all of the cells on the page with the determining level being set, the operation flow is ended.

If the result of checking of the threshold voltage is determined that the threshold voltage level has been raised to the predetermined threshold value, an affirmative determination is performed and thus the verifying operation is completed. If the level has not been raised, an N0 signal is output and thus a rewriting operation is performed.

As shown in FIG. 8 which is a diagram showing a circuit equivalent to a NAND EEPROM, the cell must serve as a transfer gate when the cell is not selected. Therefore, the threshold value of the cell having the floating gate, to which electrons have been injected, must be distributed as shown in FIG. 9. The maximum value of the threshold value is determined in accordance with the voltage of the control gate in reading. Although the restriction can be loosened by raising the foregoing voltage, there arises a possibility of an error writing in reading. The minimum value is a potential with which a state is determined as to whether data has been erased or written, the minimum value being 0V for a usual NAND flash memory EEPROM.

Accordingly, a sequence is employed in which the verifying operation is performed after the writing operation has been performed and rewriting is performed if writing has been performed insufficiently and writing is completed if writing has been performed sufficiently (see FIG. 11). The the NAND EEPROM is structured such that the foregoing operation is performed simultaneously in each cell of the plural memory cells connected in the same row. To determine whether or not writing has been performed, voltage higher than 0V, for example, 0.5V is applied to the control gate of the selected memory cell in place of 0V.

The voltage 0.5V is provided for an operation margin.

The NAND EEPROM has been known to have a structure such that the start writing voltage is set to be a low level and then the writing voltage is sequentially raised to prevent a fact that the threshold value of the cell does not exceed the maximum value in order to be adaptable to cells, to which writing can be performed at low speed.

Even if the determining level is set to be a strict level (that is, it the absolute value of the determining voltage for use in verification is large) when the threshold value is made to be included in a certain range, a problem of excessive writing arises. Specifically, in the above description, the voltage applied to the non-selected word line in the read mode is 5V, and if the power source voltage is 5V, the 5V power source voltage may be applied. However, with the tendency of miniaturization of the device, the power supply voltage has been reduced from 3.3V to 2.5V, and will reduce toward 1.8V. In such a case, it is required to boost a low power supply voltage to a 5V voltage, resulting in increase of the read time. It is preferable to restrict the boost ratio of the power source voltage to 1.5 times at most. This requires reduction of the distribution width of the threshold voltage of the cells.

BRIEF SUMMARY OF THE INVENTION

In view of the foregoing, an object of the present invention is to provide a semiconductor storage apparatus arranged to perform a verifying operation to be capable of restricting the threshold value of memory cells to which data has been written or from which data has been erased to be included in a predetermined range to prevent excessive writing, and to a writing method therefor.

The present invention is characterized in that predetermined memory cells are write-verified such that a relatively loose determination level is set (which may be the same as the level set for the reading operation or which may be higher than the same), and then the threshold value of a memory cell between the relatively loose determination level and the aim determination level is made to be higher than the aimed determination level.

According to a first aspect of the present invention, there is provided a nonvolatile semiconductor storage apparatus comprising: a memory cell array having a plurality of blocks each of which includes a plurality of memory cells connected to one row; writing means for writing data in the memory cells; and verifying means for verifying data written by the writing means, wherein verification, which is performed by the verifying means, is performed by using a plurality of determining voltage levels.

In the nonvolatile semiconductor storage apparatus according to the first aspect of the present invention, the verifying means may have means for performing the verifying operation by using a first level determining voltage and then performing the verifying operation by using a second level determining voltage, and the absolute value of the first level determining voltage may be smaller than the absolute value of the second level determining voltage.

In the nonvolatile semiconductor storage apparatus according to the first aspect of the present invention, there may further comprise reading means, wherein the absolute value of the first level determining voltage is larger than the absolute value of a reading voltage of the reading means.

According to a second aspect of the present invention, there is further provided a method of writing data to a nonvolatile semiconductor storage apparatus, comprising the steps of: writing data in each memory cell of a memory cell array, having a plurality of blocks each of which includes a plurality of memory cells connected to one row, in accordance with a first level determining voltage; verifying data written in each memory cell in accordance with the first level determining voltage; and after the writing and verifying of data in all of the memory cells written in accordance with the first level determining voltage, writing data with a second level determining voltage having an absolute value larger than the absolute value of the first level determining voltage.

In the method of writing data to a nonvolatile semiconductor storage apparatus, according to the second aspect of the present invention, there may further comprise reading means, wherein the absolute value of the first level determining voltage is larger than the absolute value of a reading voltage of the reading means.

In the nonvolatile semiconductor storage apparatus according to the first aspect of the present invention, the verifying means may have means for performing the verifying operation by using a first level determining voltage, performing the verifying operation by using a second level determining voltage, and performing the verifying operation by successively using a third, a fourth, until m-th level determining voltage, and the absolute value of the first level determining voltage may be smaller than the absolute value of the second level determining voltage, and the absolute value of the second level determining voltage may be successively smaller than the absolute values of the third, fourth until m-th determining voltage. There may further comprise reading means, wherein the absolute value of the first level determining voltage is larger than the absolute value of a reading voltage of the reading means.

According to a third aspect of the present invention, there is further provided a method of writing data to a nonvolatile semiconductor storage apparatus, comprising the steps of: writing data in each memory cell of a memory cell array, having a plurality of blocks each of which includes a plurality of memory cells connected to one row, in accordance with a first level determining voltage; verifying data written in each memory cell in accordance with the first level determining voltage; and after the writing and verifying of data in all of the memory cells written in accordance with the first level determining voltage, successively writing data with second, third, until m-th level determining voltages having absolute values successively larger than the absolute value of the first level determining voltage.

In the method of writing data to a nonvolatile semiconductor storage apparatus, according to the third aspect of the present invention, there may further comprise reading means, wherein the absolute value of the first level determining voltage is larger than the absolute value of a reading voltage of the reading means.

As described above, a width of distribution of threshold values of cells which is narrower than that realized by the conventional method can be realized.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a table showing voltages to be applied to memory cells of the flash memory when reading, writing or erasing is performed;

DETAILED DESCRIPTION OF THE INVENTION

Referring to FIGS. 1 to 7, an embodiment of the present invention will now be described.

Figure 1:
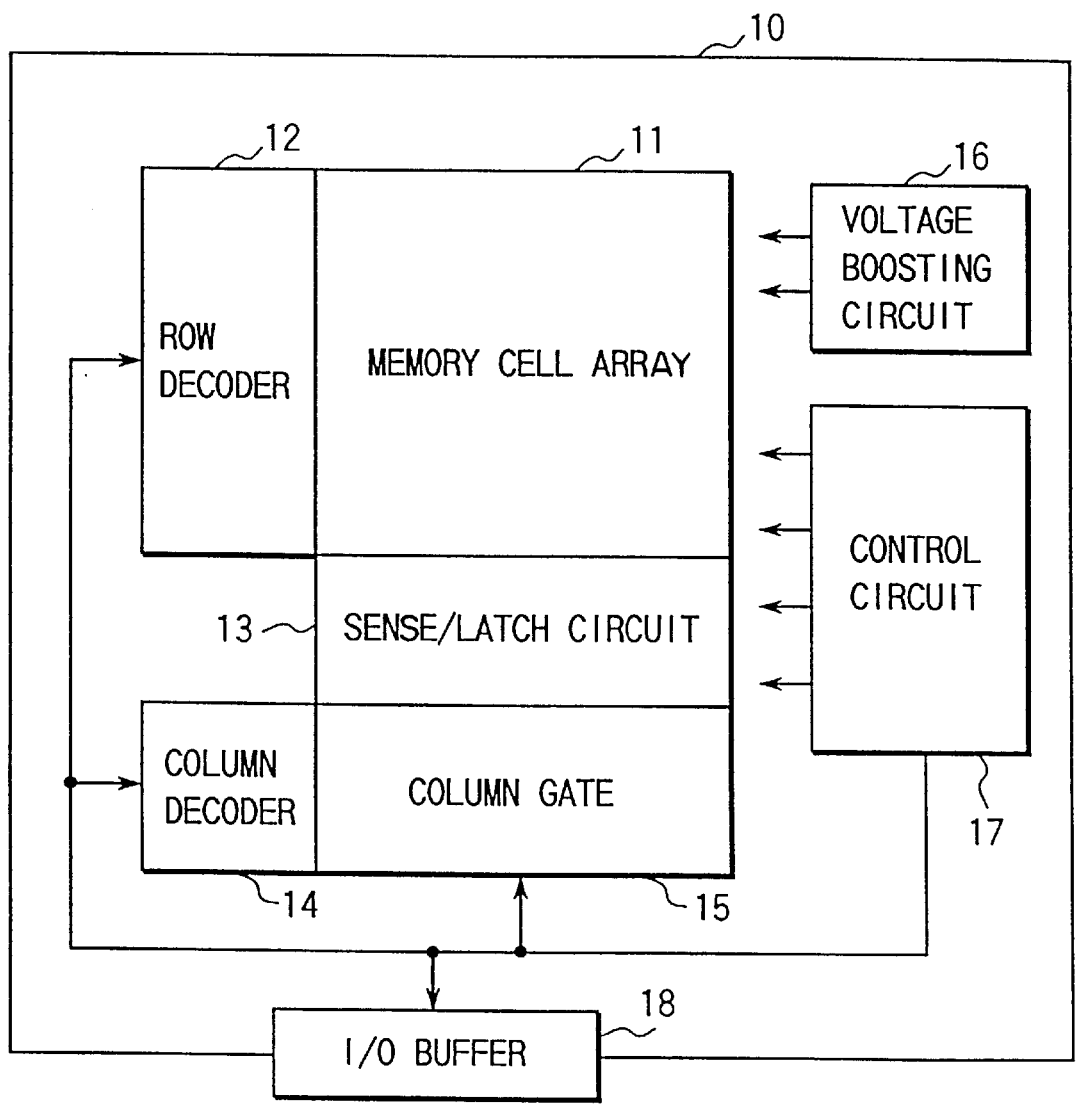
FIG. 1 is a circuit diagram showing a flash memory according to the present invention.

FIG. 1 is a block diagram showing the overall circuit for use in a nonvolatile semiconductor storage apparatus (a NAND flash memory) according to the present invention. A NAND flash memory 10 includes a memory cell array 11, a row decoder 12, sense/latch circuit 13, a column decoder 14, a column gate 15, a boosting circuit 16, a control circuit 17 and an I/O buffer circuit 18. The memory cell array 11 has a plurality of NAND memory cells disposed to form a matrix configuration in which a plurality of bit lines BL are disposed in the longitudinal direction and a plurality of word lines WL are disposed in the lateral direction. The row decoder 12 selects the word line WL in accordance with address supplied from outside. The sense/latch circuit 13 composed of a sense amplifier and a data latch circuit has a terminal connected to the bit line BL and another terminal connected to the I/O buffer circuit 18 through the column gate 15. The column decoder 14 controls the column gate 15 in accordance with address supplied from outside so as to select the bit line BL and the corresponding sense/latch circuit 13. The boosting circuit 16 supplies high voltage required in a writing operation and an erasing operation.

Figure 8:
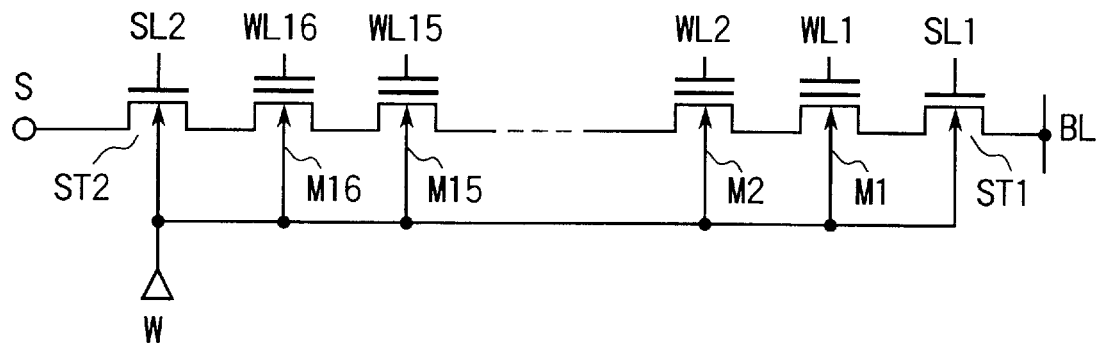
FIG. 8 is a circuit diagram showing a memory cell array of a flash memory according to the present invention and conventional technology.
Figure 9:
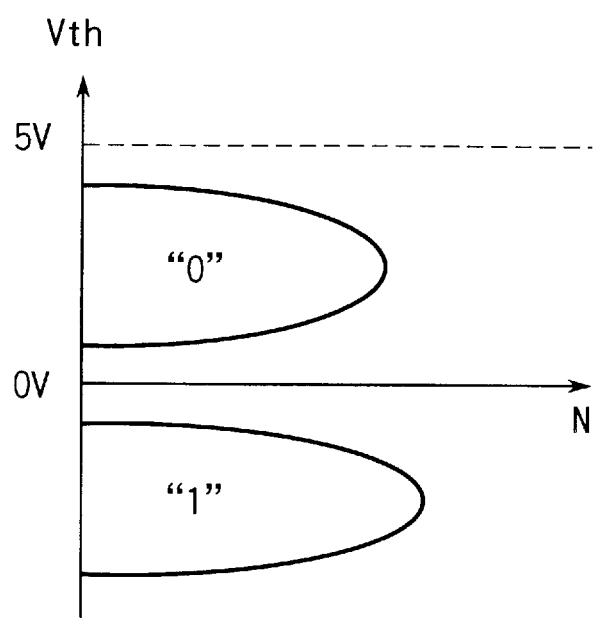
FIG. 9 is a graph showing the number of threshold values distributed in the memory cells according to the present invention and the conventional technology.
Figure 11:
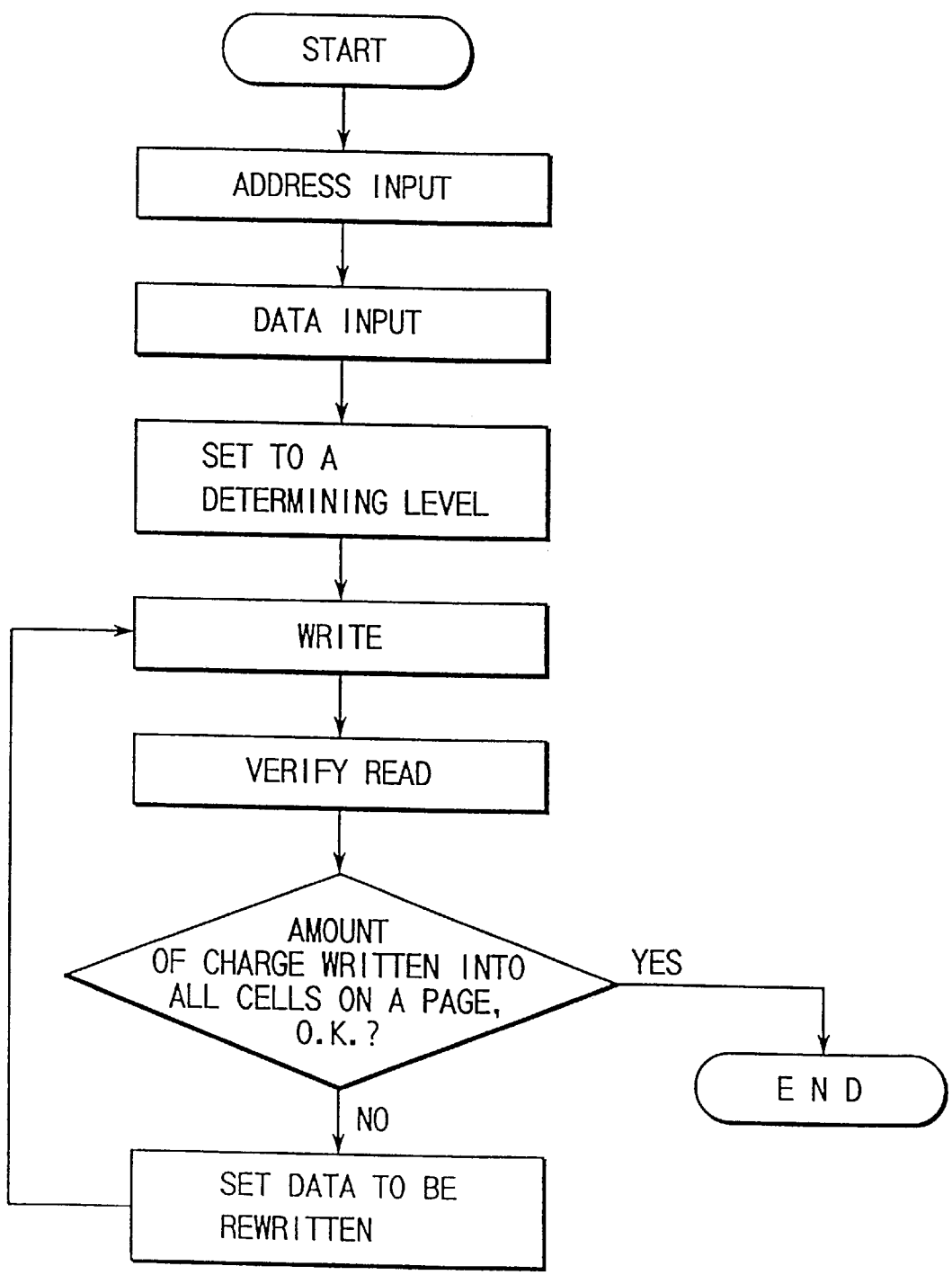
FIG. 11 is a flow chart showing a writing operation which is performed by the conventional flash memory.

The control circuit 17 controls the writing operation, the erasing operation and the reading operation. The I/O buffer circuit 18 establishes the interface with the outside of the semiconductor chip. The memory cell array 11 includes memory cells each having a circuit structure formed as shown in FIG. 8.

Figure 2:
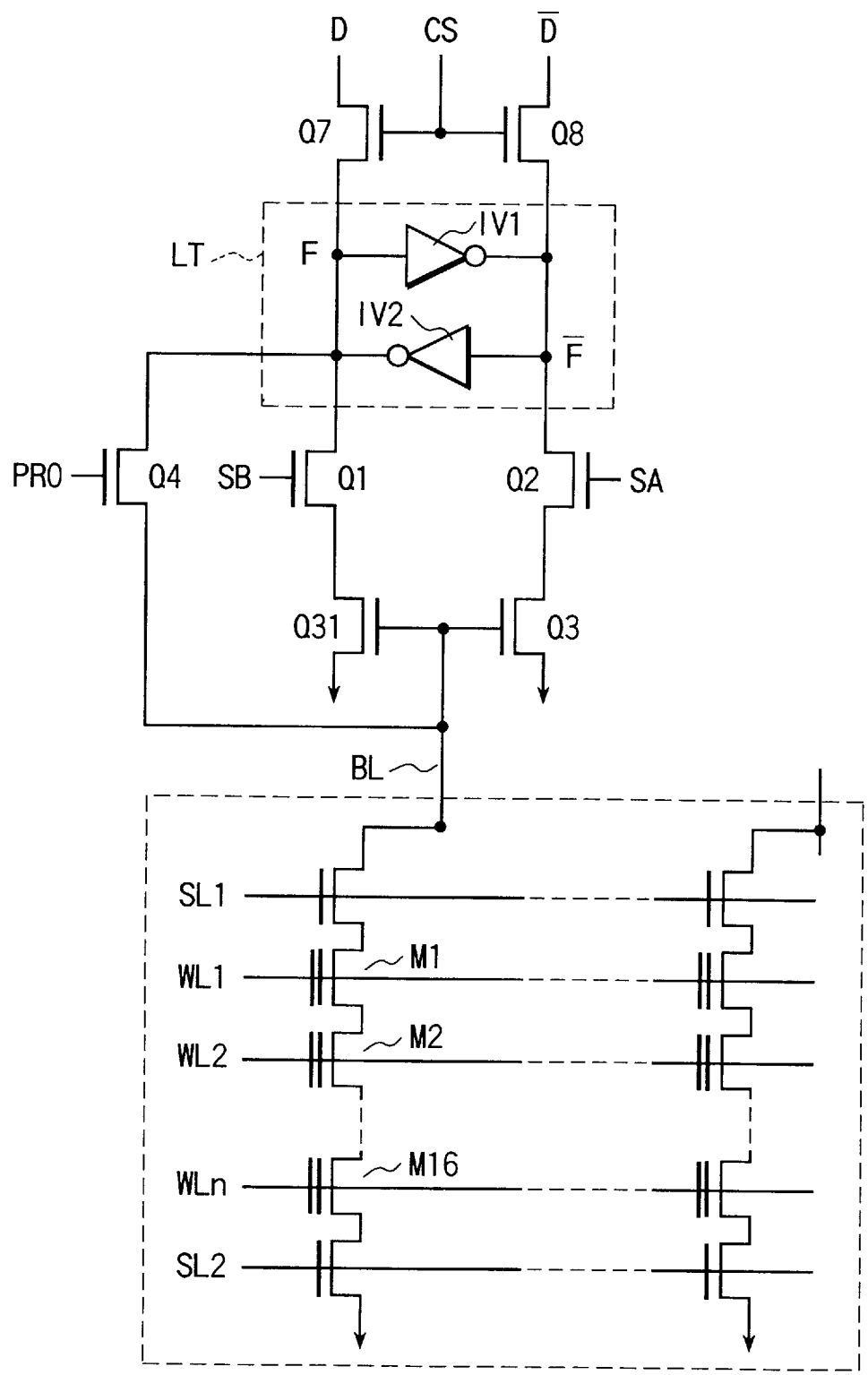
FIG. 2 is a circuit diagram showing the sense/latch circuit shown in FIG. 1.

FIG. 2 is a circuit diagram showing the detailed structure of the sense/latch circuit 13 of the flash memory shown in FIG. 1. One terminal of the current path of N-channel MOS transistor Q7 is connected to data line D, and one terminal of the current path of N-channel MOS transistor Q8 is connected to data line /D. Inverter circuits IV1 and IV2 form a latch circuit LT and are connected to the other terminals of the current paths of the transistors Q7 and Q8, forming node F and /F, respectively. An input terminal of the inverter circuit IV1 and an output terminal of the inverter circuit IV2 are connected to the node F terminal (node F) of the current path of the transistor Q7. An output terminal of the inverter circuit IV1 and an input terminal of the inverter circuit IV2 are connected to the node /F terminal (node /F) of the current path of the transistor Q8. Symbol "/" represents an inversion signal.

Referring to the sense/latch circuit shown in FIG. 2, the writing operation of the flash memory will now be described. Initially, data is latched by the latch circuit LT. When data is written in the memory cell, the node F of the latch circuit LT is set to be "L", while the node /F of the latch circuit LT is set to be "H". That is, the transistors Q7 and Q8 are turned on in response to a column selection signal CS so that the node F of the latch circuit LT is set to be "L" and the node /F of the latch circuit LT is set to be "H" through data lines D and /D. Then, the N-channel MOS transistor Q4 is turned on in response to a timing signal PRO so that data is written in the selected memory cells through the bit lines BL. The operation for writing data in the memory cells is performed as described in the related art.

When the writing operation is performed, a voltage, the level of which is varied to correspond to data to be written, is applied. That is, when data "0" is written (when the threshold value is shifted), 0V is applied to the bit line BL. When data "1" is written (the threshold value is not shifted), 9V is applied to the bit line BL. The selecting line SL1 is applied with 11V, the word line WL of the selected memory cell is applied with 18V, the word lines WL of the non-selected memory cells are applied with 9V, the selecting line SL2 is applied with 0V, the cell well W is applied with 0V and the common source line S is applied with 0V. In order to apply 9V to the bit line BL, the power supply voltage of the inverters IV1 and IV2 is increased to 9V.

The writing operation is performed after the erasing operation, and the data writing is performed from the source side. Thus, all of the transistors from the selected transistor Q1 to, for example, memory cell M15 in the series circuit are electrically conducted, so that the potential of each transistor has the same level as that of the bit line. Therefore, the memory cell having the bit line BL applied with 0V is brought to a state in which a high voltage of 18V is applied between the channel and the control electrode thereof. As a result, a tunnel current flows, thus causing the threshold value to be shifted in the positive direction. On the other hand, the memory cell having the bit line BL applied with 9V is brought to a state where only 9V is applied between the channel and the control electrode. As a result, positive directional shift of the threshold value is prevented.

If data has sufficiently been written in the memory cell, the threshold value of the memory cell is raised and the memory cell is turned off.

Then, a verifying operation for verifying a data writing state is performed such that the bit line BL is initially precharged, and then the potential of the word line WLn of the memory cell to be selected is set to be a set potential required for the verification. If data has been written in the selected memory cell and thus the threshold value has been raised sufficiently, the memory cell is turned off. Therefore, the bit line BL retains the charged potential.

If data has not been sufficiently written, the charge of the bit line BL is discharged and the potential is lowered because the memory cell has been turned on. As described above, the memory cells are selected, and then the N-channel MOS transistor Q2 is turned on by setting a timing signal SA to be "H". As a result, the node /F of the latch circuit LT is made to be "H" and the node F of the latch circuit LT is made to be "L" because the N-channel MOS transistor Q3 has been turned off in the case where the potential of the bit line BL is low. That is, if data has not sufficiently been written in the memory cell, the state of the latch circuit LT is retained to the write start state. If data has not sufficiently been written, write data stored in the latch circuit LT is used to perform the foregoing writing operation. If data has been sufficiently written in the memory cell and the potential of the bit line BL is high, the transistor Q3 is turned on and thus the state of the latch circuit LT is changed. That is, the node /F of the latch circuit LT is made to be "L" and the node F of the latch circuit LT is made to be "H".

An OR logic of nodes F of all sense/latch circuits of seven pages is used as a determining signal to determine whether or not the data write to all bits of a page has been completed.

Referring to a flow chart of the writing operation shown in FIG. 3, the overall operation flow of the present invention will now be described. The writing operation is composed of a data load cycle for serially transferring data for one page to the latch circuit through an input terminal (I/O) and a writing mode for actually writing transferred data in the memory cell.

The distribution width of the threshold values of the memory cells in which data has been written must be converged within a predetermined range. Therefore, whether or not writing has been completed is determined for each bit so as to control the writing time for each bit not to exceed the upper limit for the threshold value.

Verify reading of written data fetched in the data load cycle is performed after one time of writing operation to the memory cell has been completed. Some electrons are injected into the floating gate when data "1" is written, however, these electrons do not influence the threshold voltage of the cell. Thus, verification is not required to the "1" write data. When writing of data "0" has succeeded, the contents of the latch circuit are changed to data "1" as a result of the verify reading. If writing is insufficient, the contents of the latch circuit are retained to be data "0". Data newly set as described above is used to again perform writing. Few electrons are injected into the floating gate of the memory cell, in which data has been written successfully, because the contents of the latch circuit have been changed to data "1". Therefore, the threshold value is not raised.

Electrons are injected into the floating gate of the memory cell, in which data has not been written sufficiently, because the contents of the latch circuit are retained to data "0". When the contents of all of the latch circuits have been changed to data "1", the writing operation is completed.

Figure 3:
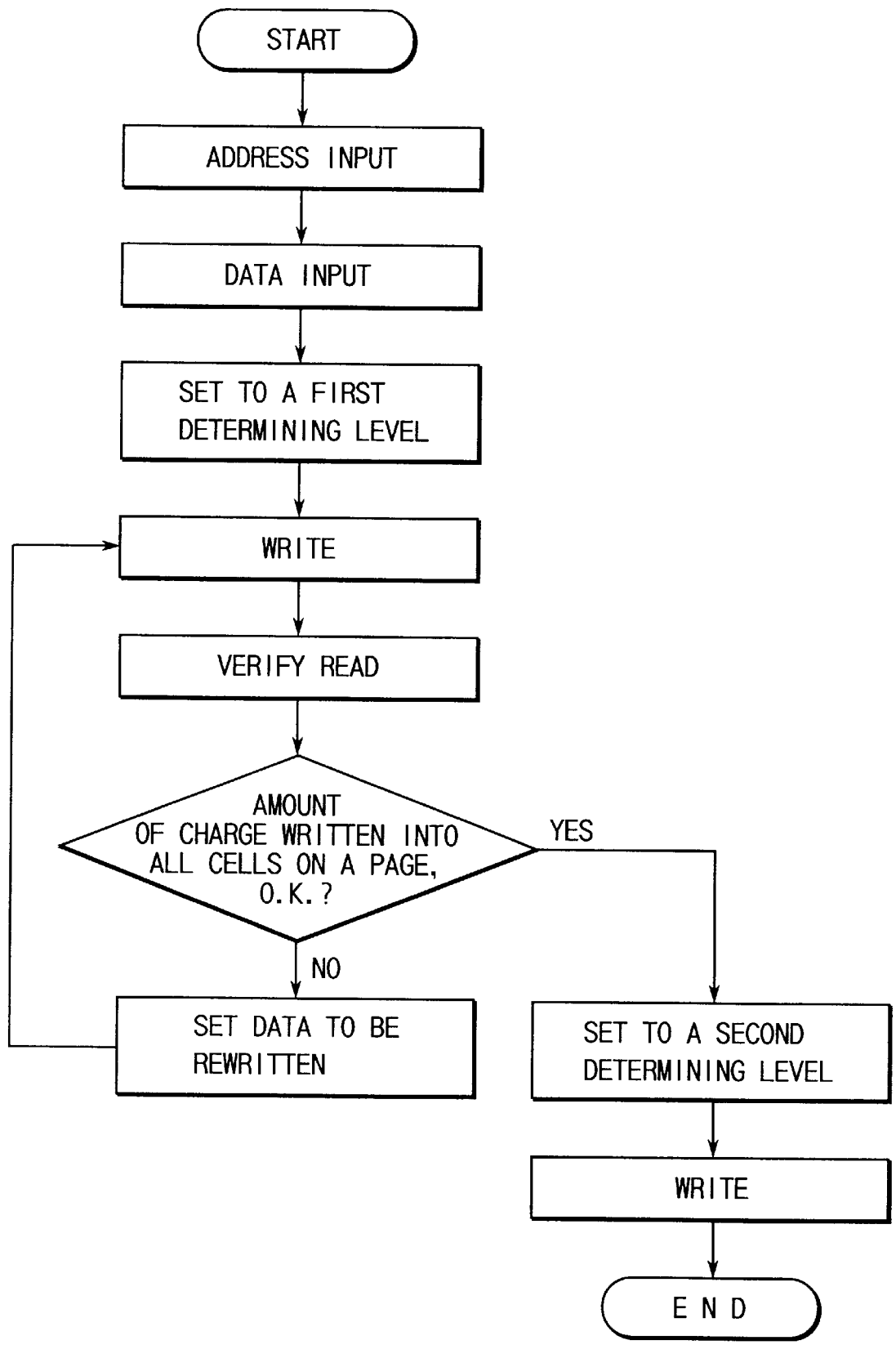
FIG. 3 is a flow chart showing a writing operation which is performed by the flash memory according to an embodiment of the present invention.

Now, to describe in detail the embodiment of FIG. 3, first, the operation flow is started, address is inputted, and data is inputted. Then, a first determining level is set, and the write operation to the memory cells on a page is performed. The first determining level is set to a loose level which is the same as the level set for data reading or higher than the loose level but lower than a finally required determining level (i.e., an aimed determining level). Each data writing, the verification, i.e., verify read, is performed with the first determining level. If there is any cell or cells in which written data is insufficient, data to be rewritten is set, and the data writing operation and the verify read are performed. This write-verify is repeated until data is sufficiently written in all of the cells on the page, when the determining level is set to the first determining level. That is, the write-verify is repeated until electron charges are sufficiently injected in all of the cells on the page, when the determining level is set to the first determining level. When data has been sufficiently written in all of the cells on the page with the first determining level being set, then a second determining level is set, and the write operation to the memory cells on the page is performed with the second determining level. After writing, the operation flow is ended. The second determining level is a finally required determining level.

The setting step of the first determining level may be transferred between the data writing step and the verify read step.

In the embodiment described in FIG. 3, writing is performed such that a first determining level is set to a loose level which is the same as the level set for data reading or higher than the loose level but lower than a finally required determining level (an aimed determining level). In accordance with the first determining level, a first writing operation is performed. Then, a second writing operation is performed in accordance with a second determining level. That is, the threshold value of the memory cell having a threshold value between the first determining level which is the loose level and the second determining level which is the finally required determining level is raised to be higher than the second determining level, namely, the writing operation is performed by two steps.

Initially, the first determining level is made to be 0V (that is, the first determining level is made to be the same as the level set for data reading) so as to perform a first writing operation. In the first writing operation, the write-verification is repeated. After the first writing operation has been completed, the determining level is set to be the second determining level (0.5V) so that memory cells whose threshold voltages are between 0V and 0.5V which is the second determining level are selected to perform a second writing operation. Then, the operation for writing data on the flash memory is completed.

Figures 4, 5A, 5B:
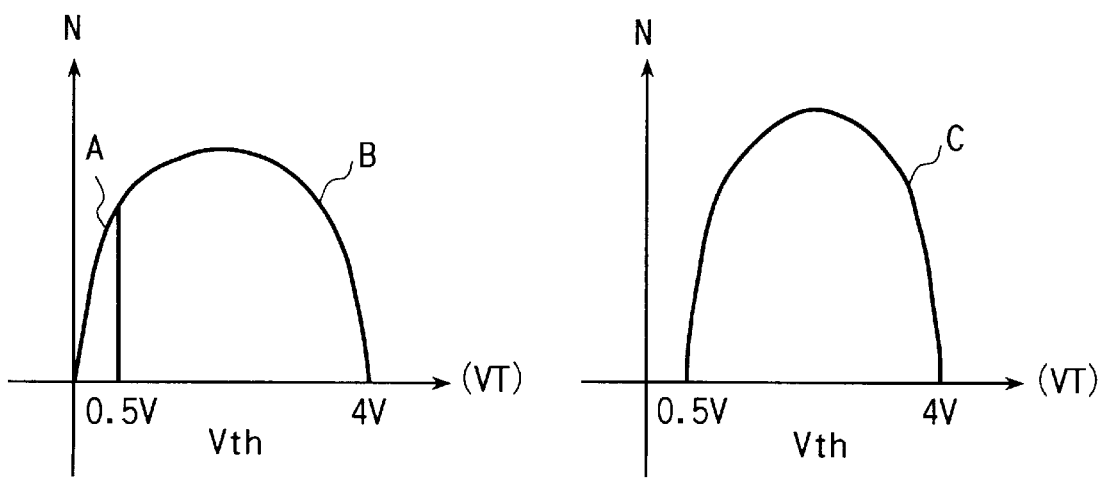
FIG. 4 is a table showing the operation of the sense/latch circuit shown in FIG. 2.
FIGS. 5A and 5B are graphs showing distributions of threshold values of whole memory cells in a flash memory to describe the effect of the present invention.

The writing operation is performed by initially operating the sense/latch circuit as shown in FIG. 4. The voltage level of 0V, which is the first determining level, is used to perform a sequence operation including the writing operation and the verification. After the sequence operation has been completed, a state (1) shown in FIG. 4 is realized in both the case of data "1" and the case of data "0". That is, the node F of the sense/latch circuit shown in FIG. 2 is made to be "H" and the node /F of the same is made to be "L" so that data is written.

Then, the bit line BL is precharged to "H" while maintaining the latch state so that data is read with the determining level of 0V. Specifically, in order to read data with the determining level of 0V, 0V is applied to the selected word line so that the memory cells connected to the selected word line are selected. In this time, 5V is applied to the non-selected word lines so that the memory cells connected to the non-selected word lines are turned on. At this time, the memory cell, in which data "1" has been written (the memory cell is called "1" data cell), satisfies a relationship BL="L". On the other hand, the memory cell, in which data "0" has been written (the memory cell is called "0" data cell), satisfies a relationship BL="H". Then, sensing is performed at SB="H" and SA="L". As a result of the foregoing sensing operation, a state (2) shown in FIG. 4 is realized. In this state, data can be again written in the "0" data cell. The read mode in which data is read at SB="H" and SA="L" while maintaining the latch state is defined as a reverse verify read.

Then, the bit line BL is precharged to "H" while maintaining the latch state so that data is read with 0.5V which is the second determining level. To be specific, in order to read data with the determining level of 0.5V, 0.5V is applied to the selected word line so that the memory cells connected to the selected word line are selected. In this time, 5V is applied to the non-selected word lines so that the memory cells connected to the non-selected word lines are turned on. Assuming that the threshold value (Vth) of the memory cell is VT, BL is made to be "H" when VT>0.5. When VT<0.5, BL="L". Then, sensing is performed by using the relationship that SB="L" and SA="H". As a result, a state (3) shown in FIG. 4 is realized. Thus, only in a case where 0<VT<0.5, the node F is made to be "L" and the node /F is made to be "H". When the latched data is transferred to the bit line BL so as to be written, the bit line BL is made to be 0V only when 0<VT<0.5. In the other cases, the potential of the bit line BL is made to be "H". That is, data can additionally be written in only the cells satisfying 0<VT<0.5.

Referring to FIGS. 5A and 5B, which are graphs showing distribution of threshold values of the memory cell, the width of the distribution according to the present invention will now be described. The axis of ordinate stands for the number (N) of cells and the axis of abscissa stands for threshold value Vth (V) of the memory cell. Initially, the determining level is set to be a relatively loose level (a first determining level). By using the first determining level (for example, 0V), writing and write verification are repeated. As shown in FIG. 5A, the distribution of the threshold values of the memory cell is included in a range 0<VT<4. The distribution of the threshold value is composed of region A and region B. Then, the second determining level (0.5V) which is more strict than the first determining level and which is the aimed, i.e., finally required, determining level is set. In accordance with the second determining level, data is again written in the memory cells in the region A in the distribution graph. As a result, distribution of threshold values including region C shown in FIG. 5B is formed. The distribution of the threshold values is included in a range 0.5<VT<4 which is smaller than the initial distribution of the threshold values. The minimum value of the distribution is 0.5V and the allowable maximum value is 4V.

When the width of the distribution of the threshold values is reduced as is performed in the present invention, the contents of all of the memory cells can reliably be erased when a collective erasure is performed in the erasing operation.

Thus, a verifying method can be provided with which excessive writing can easily be prevented. Since, therefore, the width of the distribution of the threshold values can be reduced, then the contents of all of the memory cells can reliably be erased when a collective erasure is performed in the erasing operation. If the writing is excessive as is conventional, then the width of the distribution of the threshold voltage values is increased. Thus, it may be impossible to erase the contents of all of the memory cells when a collective erasure is performed in the erasing operation.

Figures 6, 7:
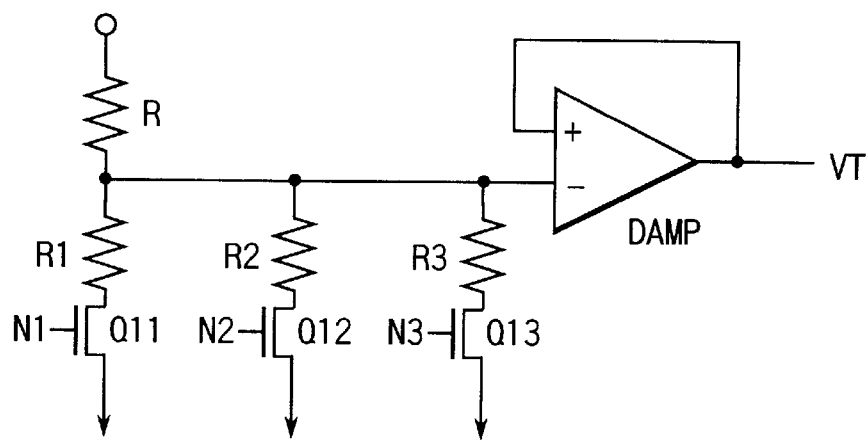
FIG. 6 is a circuit diagram showing a determining level setting circuit according to the present invention.
FIG. 7 is a table showing the operation of the determining level setting circuit shown in FIG. 6.

A circuit diagram for a determining level setting circuit for generating an arbitrary determining voltage (VT) is shown in FIG. 6. By arbitrarily selecting signals N1, N2 and N3 (by making the levels to be "H"), various potentials can be generated. An end of a resistor R is connected to a power source (Vcc), while another end of the resistor R is connected to resistors R1, R2 and R3. N-channel MOS transistors Q11, Q12 and Q13 are connected to the other ends of the resistors R1, R2 and R3. Gates of the transistors Q11, Q12 and Q13 are supplied with signals N1, N2 and N3. Each middle point between the resistor R and the resistors R1, R2 and R3 is connected to a negative input terminal of a differential amplifier DAMP. An output from the differential amplifier DAMP is connected to a positive input terminal of the differential amplifier DAMP. An output of the differential amplifier DAMP is used as the determining voltage (VT). As shown in FIG. 7, combination of the resistors R1, R2 and R3 is used to perform division of the resistance with the resistor R so that the determining voltage (VT) is generated. The resistor is selected in accordance with whether or not the levels of the signals N1, N2 and N3 are "H" or "L". The first level, that is, the first determining level is not always required to be 0V. For example, negative voltage may be employed as the first determining level. In this case, the negative VT is determined by performing biasing to the source of the memory cell and the well in which the memory cell is formed.

The above-mentioned method can be applied when a small distribution width is required to realize a multivalue cell. That is, the first determining level is made to be 0V to write data, and then the determining level is made to be 1V so as to data is additionally written in the cells satisfying 0<VT<1 so that the distribution is restricted in a range from 1V to 4V. Then, the determining level is made to be 2V so that data is additionally written in the cells satisfying 1<VT<2 so that the distribution is made to be 2V to 4V. By employing a similar method, the determining level is made to be 3V so that data is additionally written in the cells satisfying 2<VT<3. Thus, the distribution can be made to be 3V to 4V.

Figure 12:
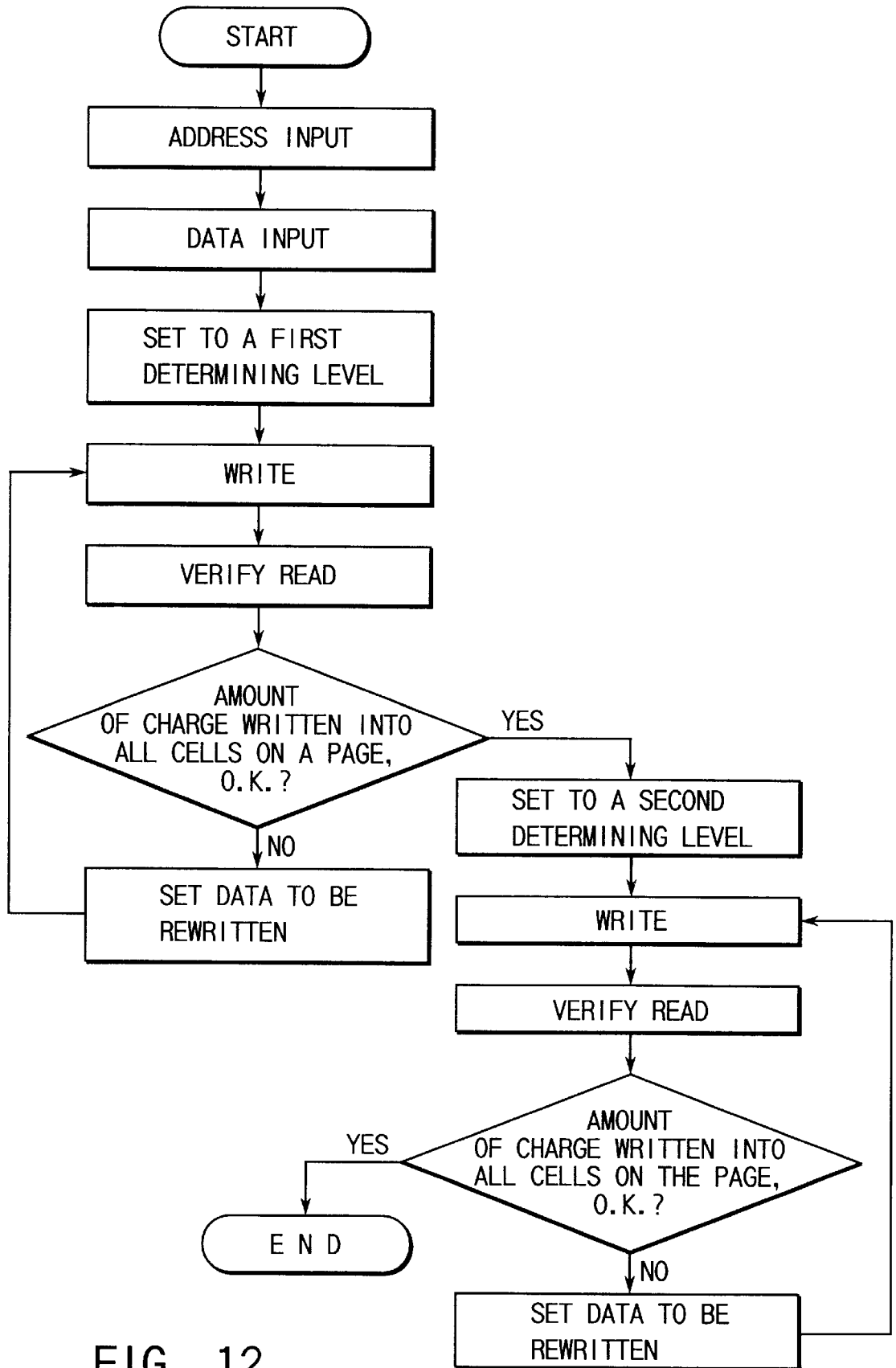
FIG. 12 is a flow chart showing a writing operation which is performed by the flash memory according to another embodiment of the present invention.

FIG. 12 is a flow chart showing a writing operation which is performed by the flash memory according to another embodiment of the present invention.

In this embodiment, a two-level verification is performed. To be specific, a first determining level is first set, and the write operation to the memory cells on a page is performed. Like the first embodiment, the first determining level is set to a loose level which is the same as the level set for data reading or higher than the loose level but lower than a finally required determining level (i.e., an aimed determining level). Each data writing, the verification, i.e., verify read, is performed with the first determining level. If there is any cell or cells in which written data is insufficient, data to be rewritten is set, and the data writing operation and the verify read are performed. This write-verify is repeated until data is sufficiently written in all of the cells on the page, when the determining level is set to the first determining level. That is, the write-verify is repeated until electron charges are sufficiently injected in all of the cells on the page, when the determining level is set to the first determining level. When data has been sufficiently written in all of the cells on the page with the first determining level being set, then a second determining level is set, and the write operation to the memory cells on the page is performed. The second determining level is a finally required determining level. Each data writing, the verification, i.e., verify read, is performed with the second determining level being set. If there is any cell or cells in which written data is insufficient, data to be rewritten is set, and the data writing operation and the verify read are performed. This write-verify is repeated until data is sufficiently written in all of the cells on the page, when the determining level is set to the second determining level. That is, the write-verify is repeated until electron charges are sufficiently injected in all of the cells on the page, when the determining level is set to the second determining level. When data has been sufficiently written in all of the cells on the page with the second determining level being set, the operation flow is ended.

The setting step of the first determining level may be transferred between the data writing step and the verify read step.

Like the first mentioned embodiment, the first level, that is, the first determining level is not always required to be 0V. For example, negative voltage may be employed as the first determining level. In this case, the negative VT is determined by performing biasing to the source of the memory cell and the well in which the memory cell is formed.

FIGS. 13A to 13D are a flow chart showing a writing operation which is performed by the flash memory according to a further embodiment of the present invention.

Figure 13A:
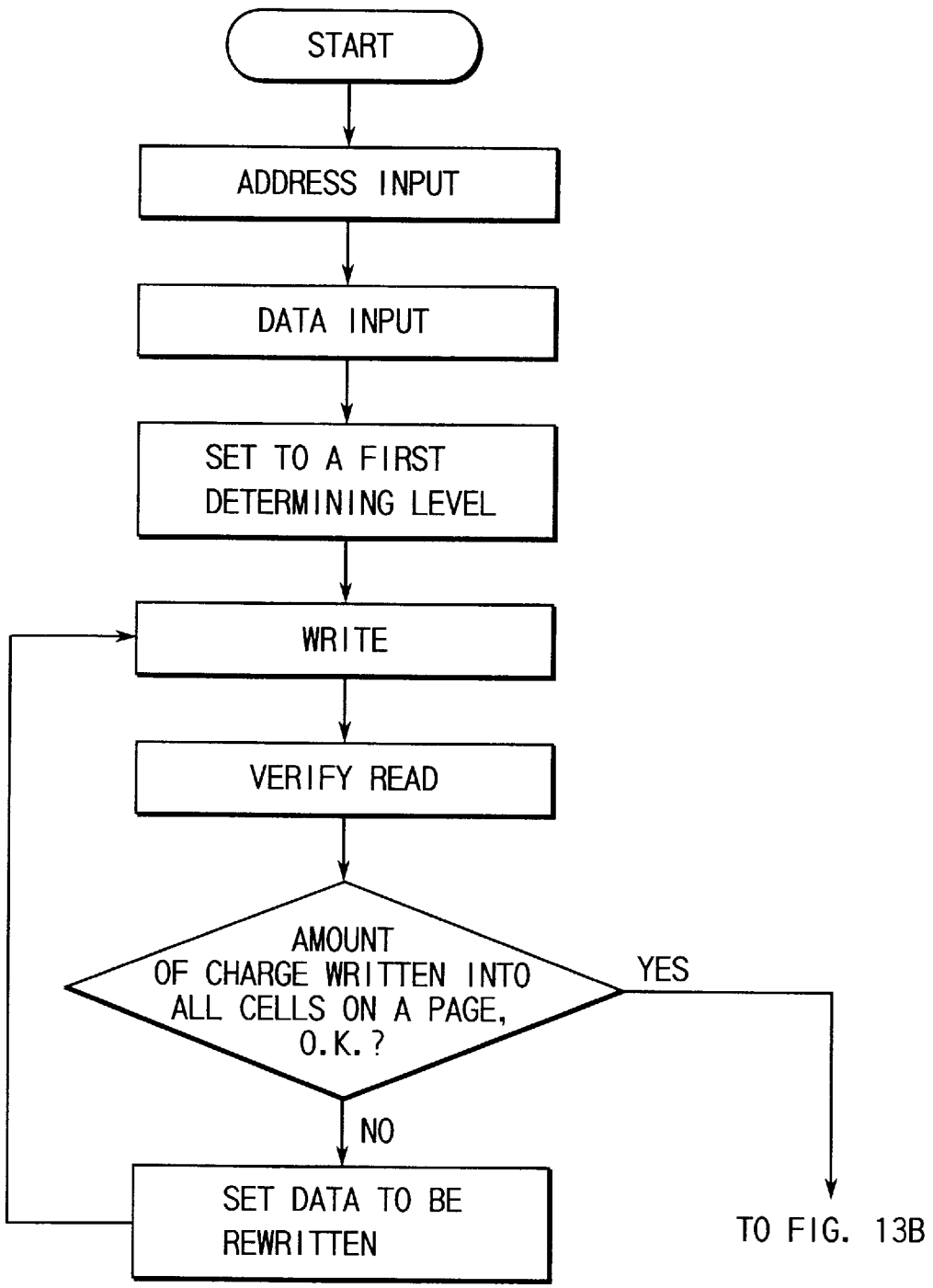
FIGS. 13A to 13D are a flow chart showing a writing operation which is performed by the flash memory according to a further embodiment of the present invention.

In this embodiment, an m-level verification is performed. To be specific, a first determining level is first set, and the write operation to the memory cells on a page is performed (FIG. 13A). Like the first and the second embodiments, the first determining level is set to a loose level which is the same as the level set for data reading or higher than the loose level but lower than an m-th determining level which is an aimed, i.e., finally required, determining level (FIG. 13D). Each data writing, the verification, i.e., verify read, is performed with the first determining level being set. If there is any cell or cells in which written data is insufficient, data to be rewritten is set, and the data writing operation and the verify read are performed. This write-verify is repeated until data is sufficiently written in all of the cells on a page, when the determining level is set to the first determining level. That is, the write-verify is repeated until electron charges are sufficiently injected in all of the cells on a page, when the determining level is set to the first determining level.

The setting step of the first determining level may be transferred between the data writing step and the verify read step.

Figure 13B:
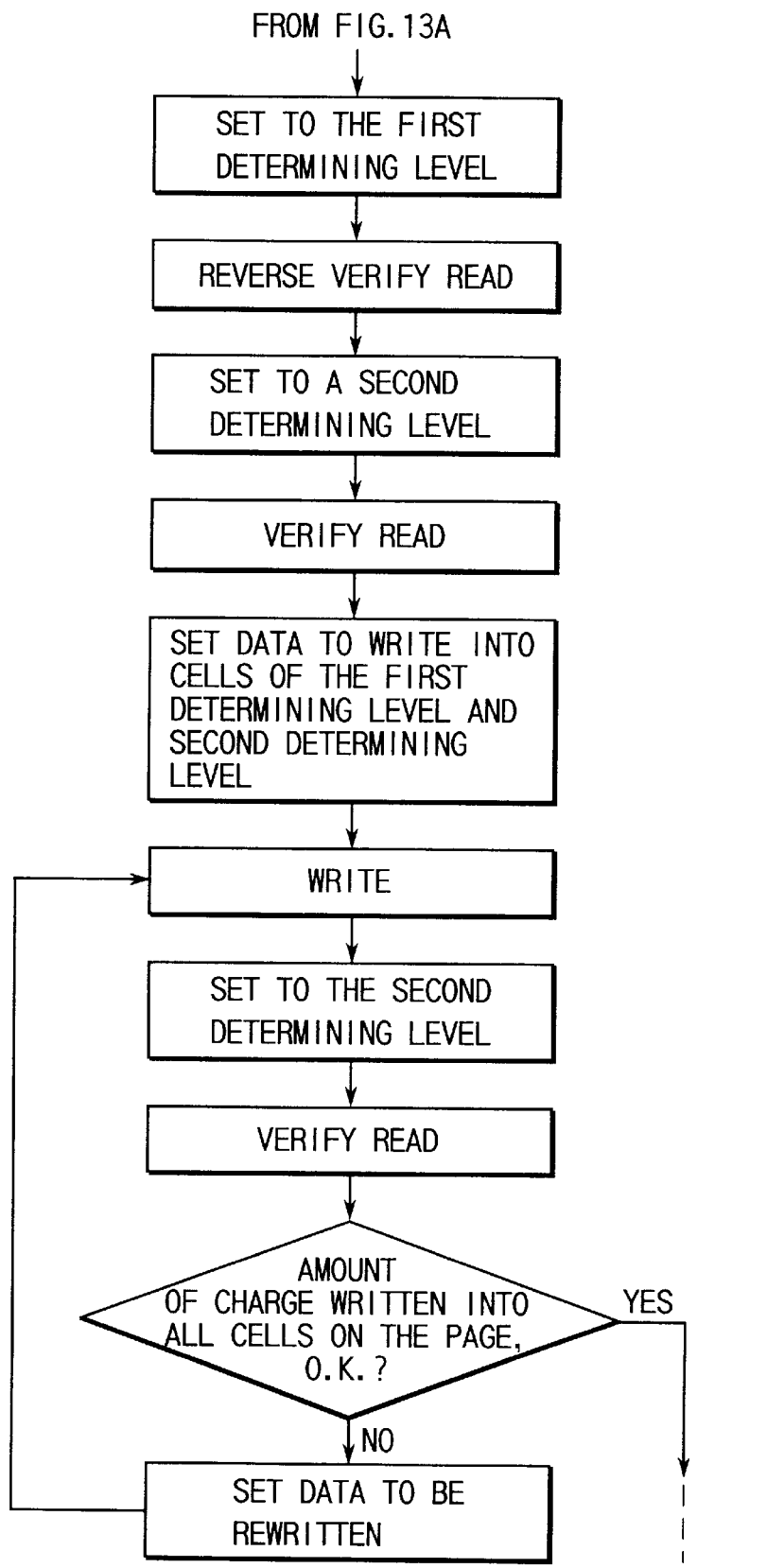

When data has been sufficiently written in all of the cells on the page with the first determining level being set, then the first determining level is again set, and a reverse verify read is performed (FIG. 13B). Next, a second determining level is set, and a verify read is performed. The second determining level in this embodiment is not a finally required determining level, but a determining level higher than the first determining level but lower than the finally required determining level. Next, data is set to write into the cells of the first determining level and the second determining level, and a writing operation is performed. Then, the second determining level is again set, and a verify read is performed. If there is any cell or cells in which written data is insufficient, data to be rewritten is set, and the data writing operation and the verify read are performed. This write-verify is repeated until data is sufficiently written in all of the cells on the page, when the determining level is set to the second determining level. That is, the write-verify is repeated until electron charges are sufficiently injected in all of the cells on the page, when the determining level is set to the second determining level.

Figure 13C:
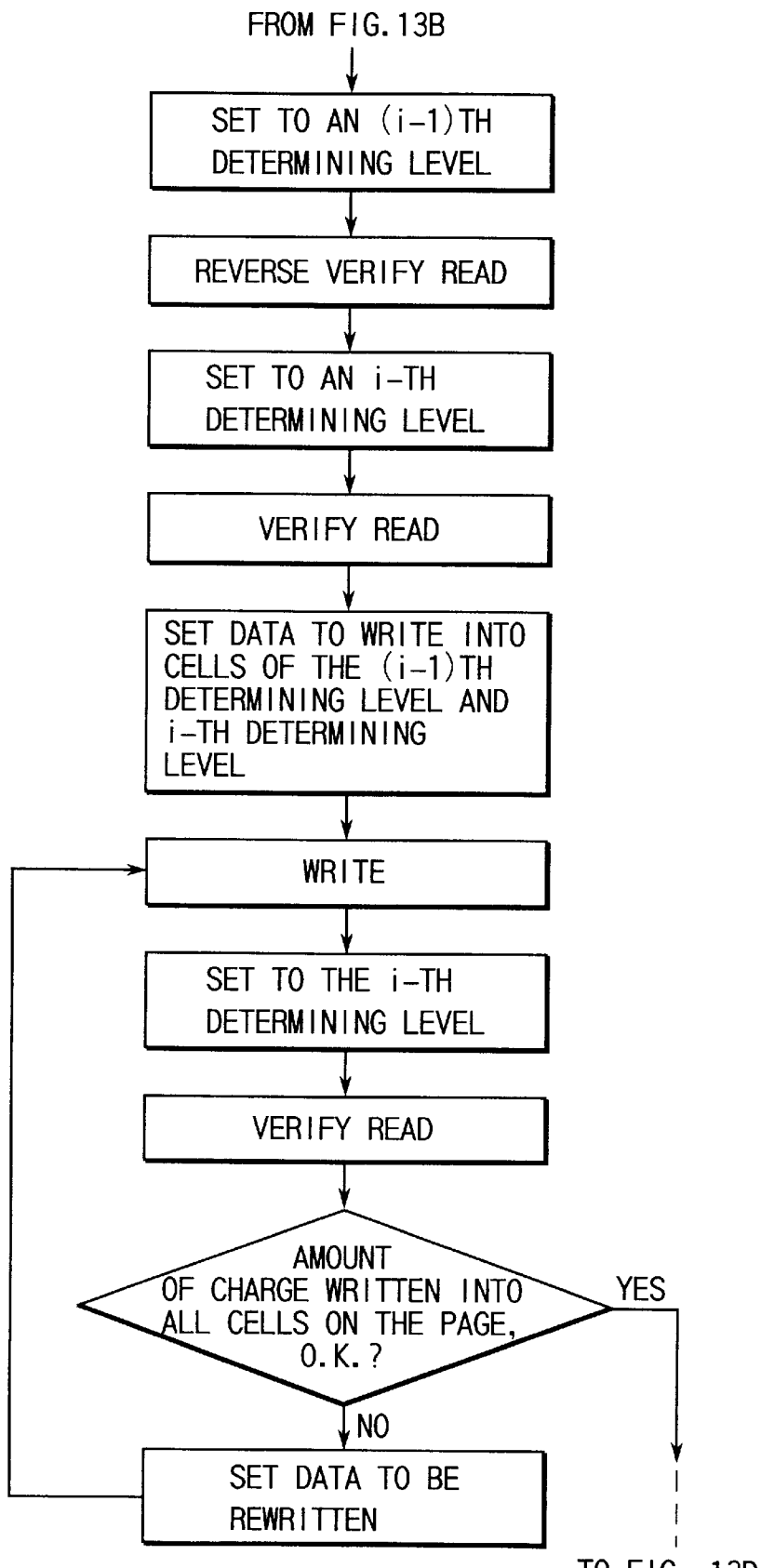
Figure 13D:
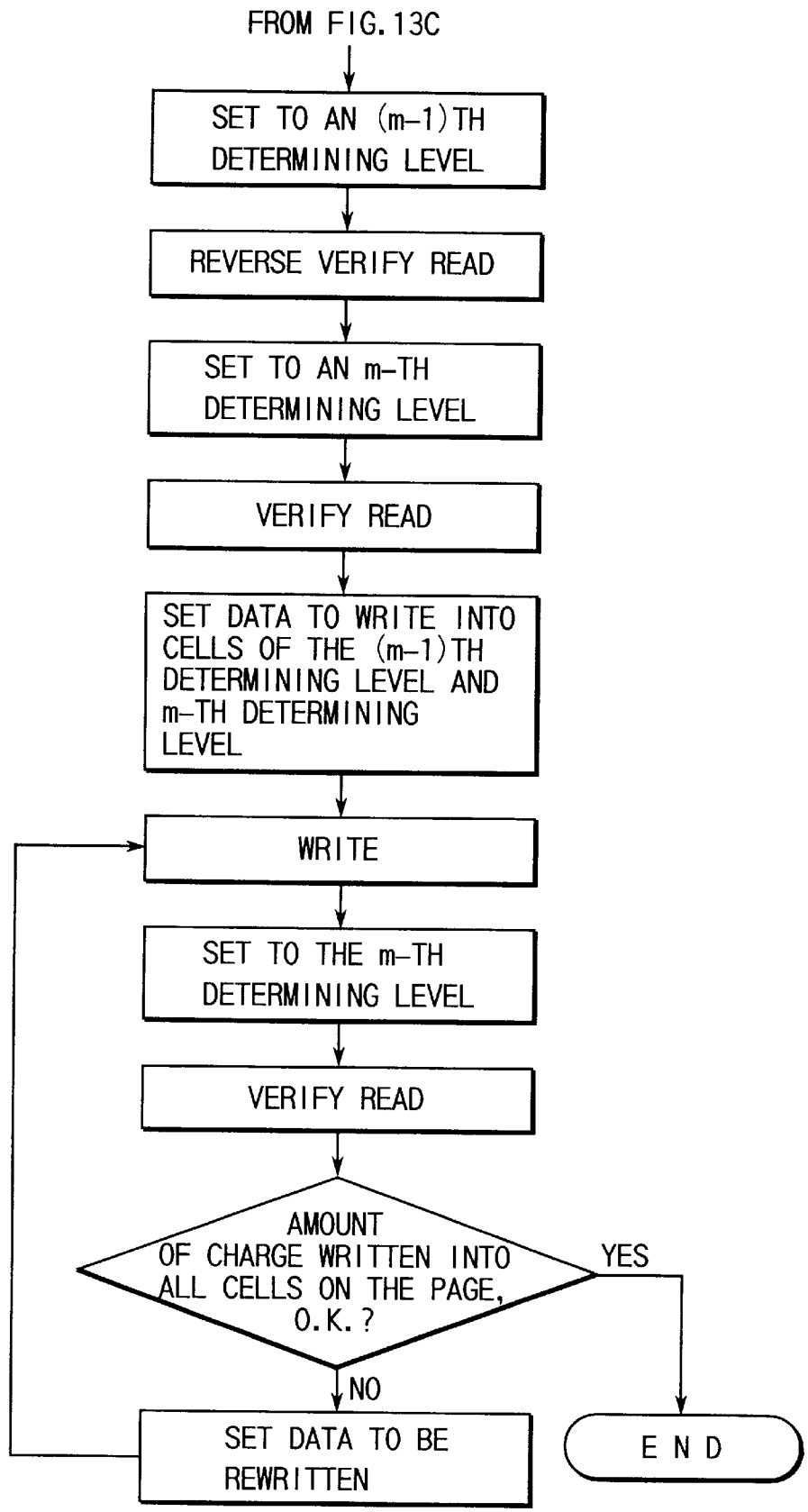

Thereafter, an operation flow similar to that of FIG. 13B is performed in relation to the following different determining levels. For example, as shown in FIG. 13C, an (i-1)th determining level is set, and a reverse verify read is performed. Next, an i-th determining level is set, and a verify read is performed. The i-th determining level is a determining level higher than the (i-1)th determining level but lower than the finally required m-th determining level. Next, data is set to write into the cells of the (i-1)th determining level and the i-th determining level, and a writing operation is performed. Then, the i-th determining level is again set, and a verify read is performed. If there is any cell or cells in which written data is insufficient, data to be rewritten is set, and the data writing operation and the verify read are performed. This write-verify is repeated until data is sufficiently written in all of the cells on the page, when the determining level is set to the i-th determining level. That is, the write-verify is repeated until electron charges are sufficiently injected in all of the cells on the page, when the determining level is set to the i-th determining level.

Thereafter, an operation flow similar to that of FIG. 13C is performed in relation to the following different determining levels, and finally an operation flow as shown in FIG. 13D is performed. Specifically, as shown in FIG. 13D, an (m-1)th determining level is set, and a reverse verify read is performed. Next, the m-th determining level is set, and a verify read is performed. The m-th determining level is the finally required determining level. Next, data is set to write into the cells of the (m-1)th determining level and the m-th determining level, and a writing operation is performed. Then, the m-th determining level is again set, and a verify read is performed. If there is any cell or cells in which written data is insufficient, data to be rewritten is set, and the data writing operation and the verify read are performed. This write-verify is repeated until data is sufficiently written in all of the cells on the page, when the determining level is set to the m-th determining level. That is, the write-verify is repeated until electron charges are sufficiently injected in all of the cells on the page, when the determining level is set to the m-th determining level. When data has been sufficiently written in all of the cells on the page with the m-th determining level being set, the operation flow to the memory cells is ended.

In the third embodiment shown in FIGS. 13A to 13D, like the first and second mentioned embodiments, the first level, that is, the first determining level is not always required to be 0V. For example, negative voltage may be employed as the first determining level. In this case, the negative VT is determined by performing biasing to the source of the memory cell and the well in which the memory cell is formed.

The verifying means may perform the verifying operation by using a first level determining voltage, perform the verifying operation by using a second level determining voltage, and perform the verifying operation by successively using a third, a fourth, until m-th level determining voltage, and the absolute value of the first level determining voltage may be smaller than the absolute value of the second level determining voltage, and the absolute value of the second level determining voltage may be successively smaller than the absolute values of the third, fourth until m-th determining voltage. The semiconductor storage apparatus may further comprise reading means wherein the absolute value of the first level determining voltage is larger than the absolute value of reading voltage of said reading means. A method of writing data to the nonvolatile semiconductor storage apparatus, comprises the steps of: writing data in each memory cell of a memory cell array, having a plurality of blocks each of which includes a plurality of memory cells connected to one row, in accordance with first level determining voltage; verifying data written in each memory cell in accordance with the first level determining voltage; and after the writing and verifying of data in all of the memory cells written in accordance with the first level determining voltage, successively writing data with second, third, until m-th level determining voltages having absolute values successively larger than the absolute value of said first level determining voltage.

In the method of writing data to a nonvolatile semiconductor storage apparatus, the absolute value of the first level determining voltage may be larger than the absolute value of reading voltage of said reading means.

In the present invention, write verification is performed with a plurality of determining levels. Thus, the width of the distribution of the threshold values of the written memory cells can satisfactorily be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A nonvolatile semiconductor storage apparatus comprising:
    a memory cell array having a plurality of blocks each of which includes a plurality of memory cells connected to one row;
    writing means for writing-data in said memory cells; and
    verifying means for verifying data written by said writing means, wherein
    verification, which is performed by said verifying means, is performed by using a plurality of determining voltage levels.

2. A nonvolatile semiconductor storage apparatus according to claim 1, wherein said verifying means has means for performing the verifying operation by using a first level determining voltage and then performing the verifying operation by using a second level determining voltage, and the absolute value of the first level determining voltage is smaller than the absolute value of the second level determining voltage.

3. A nonvolatile semiconductor storage apparatus according to claim 2, further comprising reading means, wherein the absolute value of the first level determining voltage is larger than the absolute value of a reading voltage of said reading means.

4. A nonvolatile semiconductor storage apparatus according to claim 2, further comprising reading means, wherein the absolute value of the first level determining voltage is larger than the absolute value of a reading voltage of said reading means.

5. A method of writing data to a nonvolatile semiconductor storage apparatus, comprising the steps of:
    writing data in each memory cell of a memory cell array, having a plurality of blocks each of which includes a plurality of memory cells connected to one row, in accordance with a first level determining voltage;
    verifying data written in each memory cell in accordance with the first level determining voltage; and
    after the writing and verifying of data in all of the memory cells written in accordance with the first level determining voltage, writing data with a second level determining voltage having an absolute value larger than the absolute value of the first level determining voltage.

6. A method of writing data to a nonvolatile semiconductor storage apparatus, according to claim 5, further comprising reading means, wherein the absolute value of the first level determining voltage is larger than the absolute value of a reading voltage of said reading means.

7. A nonvolatile semiconductor storage apparatus according to claim 1, wherein said verifying means has means for performing the verifying operation by using a first level determining voltage, performing the verifying operation by using a second level determining voltage, and performing the verifying operation by successively using a third, a fourth, until m-th level determining voltage, and the absolute value of the first level determining voltage is smaller than the absolute value of the second level determining voltage, and the absolute values of the third, fourth until m-th determining voltages are successively larger.

8. A nonvolatile semiconductor storage apparatus according to claim 7, further comprising reading means, wherein the absolute value of the first level determining voltage is larger than the absolute value of a reading voltage of said reading means.

9. A method of writing data to a nonvolatile semiconductor storage apparatus, comprising the steps of:
    writing data in each memory cell of a memory cell array, having a plurality of blocks each of which includes a plurality of memory cells connected to one row, in accordance with a first level determining voltage;
    verifying data written in each memory cell in accordance with the first level determining voltage; and
    after the writing and verifying of data in all of the memory cells written in accordance with the first level determining voltage, successively writing data with second, third, until m-th level determining voltages having absolute values successively larger than the absolute value of the first level determining voltage.

10. A method of writing data to a nonvolatile semiconductor storage apparatus, according to claim 9, further comprising reading means, wherein the absolute value of the first level determining voltage is larger than the absolute value of a reading voltage of said reading means.

11. A semiconductor memory device comprising:
    a memory cell array including nonvolatile memory cells each having a data state set by the threshold voltage thereof;
    writing circuitry for writing data to said nonvolatile memory cells during a writing operation by setting the respective threshold voltages thereof; and
    a verify circuit for verifying the writing of the data to said nonvolatile memory cells,
    wherein said verify circuit is configured to use a first determining voltage to determine which ones of said nonvolatile memory cells have threshold voltages outside a first threshold voltage range after each time said writing circuitry writes the data to said nonvolatile memory cells and said writing circuitry is configured to rewrite the data to the ones of said nonvolatile memory cells having threshold voltages outside the first threshold voltage range until said verify circuit determines that all of said nonvolatile memory cells have threshold voltages in the first threshold voltage range, and
    wherein said verify circuit is further configured to use a second determining voltage to determine which ones of said nonvolatile memory cells having threshold voltages in the first threshold voltage range have threshold voltages outside a second threshold voltage range and said writing circuitry is further configured to rewrite the data to the ones of said nonvolatile memory cells having threshold voltages outside the second threshold voltage range.

12. The semiconductor memory device according to claim 11, wherein said writing circuitry is configured to rewrite the data until said verify circuit determines that all of said nonvolatile memory cells have threshold voltages in the second threshold voltage range.

13. The semiconductor memory device according to claim 11, wherein said nonvolatile memory cells each stores multi-level data.

14. The semiconductor memory device according to claim 11, wherein said nonvolatile memory cells are arranged in a NAND configuration.

15. A method for writing data in nonvolatile memory cells each having a data state set by the threshold voltage thereof, the method comprising the steps of:

(a) setting a first determining voltage;

(b) writing data to said nonvolatile memory cells;

(c) using the first determining voltage to determine which ones of said nonvolatile memory cells have threshold voltages outside a first threshold voltage range;

(d) rewriting the data to the ones of said nonvolatile memory cells having threshold voltages outside the first threshold voltage range;

(e) using the fist determining voltage to determine which ones of said memory cells to which data is re-written in step (d) have threshold voltages outside the first threshold voltage range;

(f) repeating steps (d) and (e) until the threshold voltages of all of said nonvolatile memory cells are within the first threshold voltage range;

(g) setting a second determining voltage;

(h) using the second determining voltage to determine which ones of said memory cells have threshold voltages outside a second threshold voltage range; and (i) rewriting the data to the ones of said nonvolatile memory cells having threshold voltages outside the second threshold voltage range.

16. The method according to claim 15, comprising the further steps of:

(j) repeating steps (h) and (i) until the threshold voltages of all of said nonvolatile memory cells are within the second threshold voltage range.

17. The method according to claim 16, comprising the further steps of:

(k) setting an i-th determining voltage;

(l) using the i-th determining voltage to determine which ones of said nonvolatile memory cells have threshold voltages outside an i-th threshold voltage range;

(m) rewriting the data to the ones of said nonvolatile memory cells having threshold voltages outside the i-th threshold voltage range;

(n) repeating steps (l) and (m) until the threshold voltages of all of said nonvolatile memory cells are within the i-th threshold voltage range; and (o) repeating steps (k) through (n) until i=m, wherein i and m are numbers greater than or equal to 3.

18. The method according to claim 15, wherein said nonvolatile memory cells each stores multi-value data.

19. The method according to claim 15, wherein said nonvolatile memory cells are arranged in a NAND configuration.

* * * * *